United States Patent [19]

Logan et al.

[11] 4,159,452
[45] Jun. 26, 1979

[54] DUAL BEAM DOUBLE CAVITY HETEROSTRUCTURE LASER WITH BRANCHING OUTPUT WAVEGUIDES

[75] Inventors: Ralph A. Logan, Morristown; James L. Merz, Madison, both of N.J.

[73] Assignee: Bell Telephone Laboratories, Incorporated, Murray Hill, N.J.

[21] Appl. No.: 869,367

[22] Filed: Jan. 13, 1978

[51] Int. Cl.² .............................................. H01S 3/19
[52] U.S. Cl. ........................... 331/94.5 H; 350/96.11; 350/96.12
[58] Field of Search ............... 331/94.5 H; 350/96.11, 350/96.12, 96.13, 96.14

[56] References Cited

U.S. PATENT DOCUMENTS

| 3,948,583 | 4/1976 | Tien ................................... 350/96.11 |
| 3,978,426 | 8/1976 | Logan et al. .................... 331/94.5 H |

OTHER PUBLICATIONS

H. Yajima, "Dielectric Thin-Film Optical Branching Waveguide", *Appl. Phys. Let.*, vol. 22, No. 12, pp. 647-649, Jun. 15, 1973.
W. K. Burns et al., "Mode Conversion in Planar-Dielectric Separating Waveguides", *IEEE Journal of Quantum Electronics*, vol. QE-11, No. 1, pp. 32-39, Jan. 1975.

*Primary Examiner*—James W. Davie
*Attorney, Agent, or Firm*—Michael J. Urbano; Benita J. Rohm

[57] ABSTRACT

A dual beam laser incorporates a tapered layer within the optical cavity of a GaAs-AlGaAs double heterostructure laser. Dual output waveguides are therefore provided at one of the mirrors. By suitable variations of layer thickness and/or composition, the device operates either as a tapered power divider (TPD), branching the incident power of a single mode into the two output arms of the device, or as a tapered mode splitter (TMS), diverting different transverse modes into different arms. Because the different modes of the TMS have different thresholds, the laser can be pulsed with current pulses of different amplitude to control at which of the waveguides an output appears. The TPD, on the other hand, has coupled cavities which tend to suppress all but one dominant longitudinal mode. Also described is an integrated optical circuit embodiment of the TPD in which the resonator is formed by etched mirrors.

17 Claims, 5 Drawing Figures

DUAL BEAM DOUBLE CAVITY HETEROSTRUCTURE LASER WITH BRANCHING OUTPUT WAVEGUIDES

BACKGROUND OF THE INVENTION

This invention relates to semiconductor junction lasers.

In the development of integrated optical devices the need has long been recognized for the efficient division of optical power between two or more waveguides. The signal in one waveguide might be a carrier modulated with telecommunication information, for example, whereas the signal in the other waveguide might be employed in a feedback scheme to stabilize the output of the laser used to generate the carrier.

One method for achieving power division in different waveguides utilizes phase coupling between a pair of synchronous waveguides. For example, many different schemes have been devised for electro-optic phase-coupled switching in LiNbO$_3$ and GaAs devices. Another approach, with less-stringent fabrication tolerances, involves the use of branching waveguides which either divide the optical power between two (or more) channels, or separate different transverse modes in the incident guide. A paper by H. Yajima in *Applied Physics Letters*, Vol. 22, p. 647 (1973) is illustrative. Yajima fabricated glass-SiO$_2$ waveguides and established the principal that an incident mode would choose the branch having a propagation constant closest to that of the propagation constant of the incident mode. A more complete theory of branching waveguides was developed later, by W. K. Burns and A. F. Milton, *IEEE Journal of Quantum Electronics*, Vol. QE-11, p. 32 (1975), who considered a planar, 5-layer theoretical structure including two waveguiding layers (2, 4) and three layers (1, 3, 5) of lower refractive index that separated and clad the two waveguiding layers. They analyzed the situation of a taper in the cladding layer separating the waveguides by a step approximation method and showed that the behavior of such a branching waveguide could be described by a transition parameter A:

$$A = |\beta_4 - \beta_2|/\theta(\beta_0^2 - 3^2 k^2)^{\frac{1}{2}}, \quad (1)$$

where $\beta_i$ (or $n_i$) is the propagation constant (or refractive index) of layer i (i=2, 3, or 4), in the region where the waveguide layers are separated by the taper, $\beta_0 = (\beta_2 + \beta_4)/2$, $k = 2\pi/\lambda$, $\lambda$ is the wavelength of the incident mode, and $\theta$ is the angle of the branching taper. If $A \lesssim 0.4$ (large $\theta$, symmetric waveguides), mode conversion occurs and the device functions as a TPD. If $A \gtrsim 0.4$, (small $\theta$, asymmetric guides), modal evolution occurs through the branching region, and the device is a TMS.

SUMMARY OF THE INVENTION

Our invention, in one illustrative embodiment, is a dual beam laser in which a tapered layer forms a pair of branching waveguides (one active and one passive) in the optical cavity of a double heterostructure (DH) junction laser so that spatially separate outputs are provided at one of the laser mirrors. By suitable choice of layer thickness and/or composition, the laser operates either as a tapered power divider (TPD), branching the incident power of a single mode into the two output arms of the device, or as a tapered mode splitter (TMS), diverting different transverse modes into different arms.

We have achieved power ratios of between 4:1 and 5:1 for a GaAs-AlGaAs TPD, operating at a wavelength of about 8850 Angstroms. For a TMS, a mode at about 8780 Angstroms exited from one output arm of the device, while a different mode at about 8550 Angstroms was observed from the other; the relative intensity of these two output beams was varied by changing the pumping current.

We have also observed that the different wavelength modes of the TMS have different thresholds so that it is possible to control at which of the waveguides the output appears by applying to the laser pumping current pulses of different amplitudes. The TPD, on the other hand, has a pair of coupled optical cavities which tend to suppress all but one dominant longitudinal mode.

In addition, while the layered configuration of our dual beam laser inherently provides vertically separated outputs, it is also possible to separate these outputs horizontally as, for example, by a suitable rib waveguide arrangement coupled to one of the branching waveguides.

BRIEF DESCRIPTION OF THE DRAWING

Our invention, together with its various features and advantages, can be readily understood from the following more detailed description taken in conjunction with the accompanying drawing in which the figures are not drawn to scale for clarity of illustration. Corresponding components have been given identical reference numerals and are distinguished from one figure to another by primed notation.

DETAILED DESCRIPTION

Figure 1:
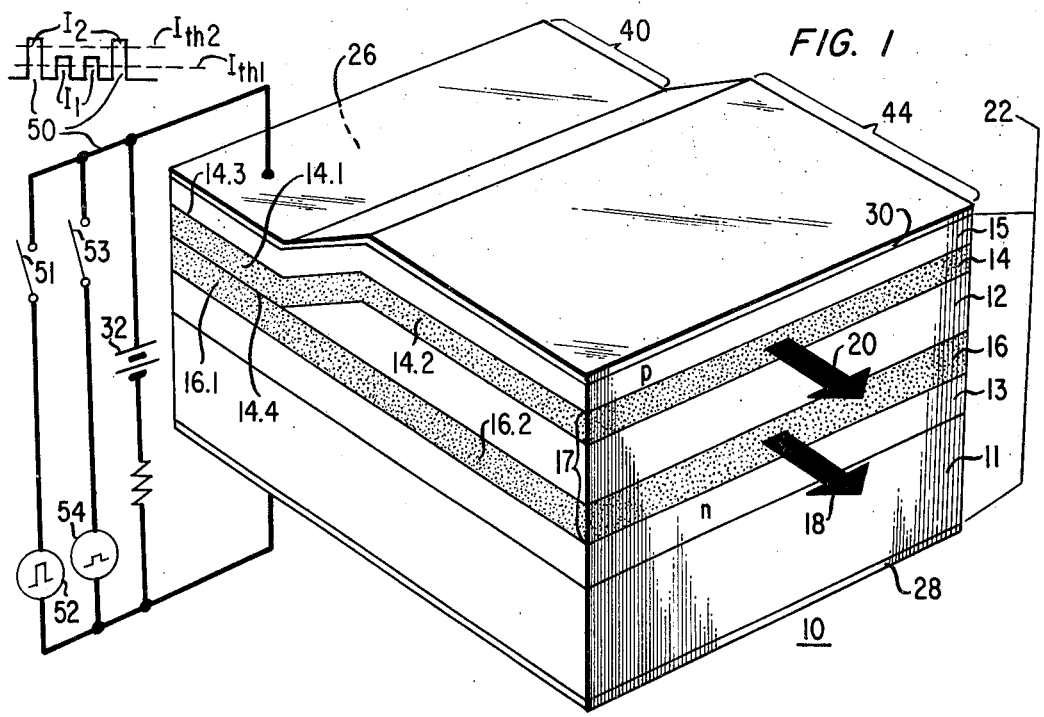
FIG. 1 is a schematic isometric view of a dual beam laser in accordance with one embodiment of our invention.

With reference now to FIG. 1, there is shown a dual beam laser 10 in which a tapered layer 12 forms a pair of branching waveguides 14 and 16 in the optical cavity of a double heterostructure junction laser so that spatially separate outputs 18 and 20 are provided at one of the laser mirrors 22. Waveguide 14 is active in the sense that stimulated radiation is generated therein by the recombination of minority carriers all along its entire length, whereas waveguide 16 is passive in the sense that radiation is coupled from the active segment 14.1 across the interface 14.4 where the waveguides are contiguous. This generated and coupled radiation propagates along the output arms 14.2 and 16.2, respectively, to the output mirror 22. Alternatively, waveguides 14 and 16 could be interchanged, so that waveguide 16 is active and waveguide 14 is passive, in the sense described above.

By suitable choice of the thickness and/or composition of the waveguides, the laser 10 can operate either as a tapered power divider, branching a single mode of radiation generated in active waveguide 14 into the two output arms 14.2 and 16.2, or as a tapered mode splitter diverting different transverse modes into the output arms 14.2 and 16.2. In general, the dual beam laser 10 functions as a TPD when waveguides 14 and 16 are similar (in composition and thickness) and the taper is relatively abrupt ($A \lesssim 0.4$), and functions as a TMS when the two waveguides are dissimilar and the taper is relatively gradual ($A \gtrsim 0.4$).

In the TPD the laser 10 has a pair of optical cavities defined by the parallel mirrors 22 and 26 and the waveguides 14 and 16 therebetween. These cavities are optically coupled by interface 14.4 so that all but one dominant longitudinal mode of the stimulated radiation is suppressed. Thus, in the TPD the two outputs have the same wavelength and the ratio of their intensities is a constant, independent of pumping current. The latter characteristic is particularly useful in feedback schemes which utilize one of the outputs (i.e., the lower power output 18) to stabilize the other output (i.e., the higher power output 20). In contrast, for the TMS the two outputs have different wavelengths and different thresholds, a characteristic which can be exploited in certain multiplexing or encoding schemes discussed hereinafter.

More specifically, the dual beam laser 10 comprises a pair of wide bandgap semiconductor cladding layers 13 and 15 of opposite conductivity types and a narrower bandgap semiconductor active region 17 disposed between and contiguous with the cladding layers, characterized in that the active region 17 includes a passive waveguide layer 16 contiguous and coextensive with the one cladding layer 13 and having a smaller bandgap than layer 13, and an active waveguide layer 14 contiguous and coextensive with the other cladding layer 15 and having a smaller bandgap than both the cladding layer 15 and waveguide layer 16. The active layer 14 is capable of generating stimulated radiation by recombination of minority carriers injected along its length when the cladding layers are forward-biased above the lasing threshold. In addition, segment 14.1 of active layer 14 is contiguous with segment 16.1 of the passive waveguide layer 16 along interface (heterojunction) 14.4, but the longitudinally adjacent portion 14.2 of active layer 14 is separate from segment 16.2 of the passive waveguide layer 16; i.e., tapered layer 12 separates the passive segment 16.2 from the active segment 14.2. Tapered layer 12 has a bandgap greater than that of the active and passive waveguide layers 14 and 16, and its taper extends along the longitudinal (resonator) axis of laser 10 so that vertically separate radiation outputs 18 and 20 are provided at mirror 22.

Alternatively, layers 14 and 16 may be the passive and active waveguide respectively, such that waveguide layer 16 has a smaller bandgap than both the cladding layer 13 and the passive waveguide 14. This arrangement has the advantage that active layer 16 would have no bends and correspondingly lower optical losses.

Pumping means for the dual beam laser 10 includes a pair of ohmic contacts 28 and 30 to the substrate 11 and cladding layer 15, respectively, and a voltage source, illustratively depicted by battery 32, connected across contacts 28 and 30 so as to forward-bias the cladding layers 13 and 15. This arrangement causes the injection of minority carriers into the active layer 14 along its entire length. The presence of the wider bandgap tapered layer 12 prevents the flow of current between segments 14.2 and 16.2. As a consequence, stimulated radiation is generated primarily in the active waveguide 14. Some radiation is generated in passive waveguide segment 16.1 because the bandgap (or refractive index) discontinuity at interface (heterojunction) 14.4 is generally sufficiently small to inadequately confine all of the injected minority carriers to the active segment 14.1. That is, some injection of minority carriers into the passive segment 16.1 does occur. As discussed hereinafter, this feature may explain the relatively large wavelength difference between the two outputs of our TMS. Whether or not such injection occurs, however, the refractive index discontinuity at interface 14.4 should be small enough to allow substantial penetration of the radiation generated in active segment 14.1 into passive segment 16.1. Thus, even in the case of relatively complete carrier confinement to the active layer 14, the difference in optical path length of the two waveguides will cause the two outputs of the TMS to have different wavelengths.

In order to reduce the number of nonradiative recombination defect centers at the various heterojunctions of our laser, especially at interfaces 14.3 and 14.4, it is preferred that the various layers be made of essentially lattice-matched materials. Fewer defect centers in general means lower lasing thresholds and longer lifetimes. In the Group III-V compound system, these materials include, for example, GaAs-AlGaAs, GaAs-AlGaAsP, GaAsSb-AlGaAsSb and InP-InGaAsP. Of these, GaAs-AlGaAs has the advantage that it is substantially lattice-matched over all solid solutions of GaAs and AlAs. Using the latter system, the dual beam laser of FIG. 1 would typically comprise a (100) n-GaAs substrate 11 on which the following layers would be epitaxially grown: an n-$Al_xGa_{1-x}As$ cladding layer 13 ($0<x<1$); an n-$Al_yGa_{1-y}As$ passive waveguide layer 16 ($0<y<1$; $y<x$); an n-$Al_zGa_{1-z}As$ tapered layer 12 ($0<z<1$; $z>y$); an n-, p- or compensated $Al_qGa_{1-q}As$ active waveguide layer 14 ($0 \leq q \lesssim 0.4$; $q<y$ and z) and a p-$Al_rGa_{1-r}As$ cladding layer 15 ($0<r<1$; $r>q$). The upper limit on q corresponds to the direct-indirect gap crossover of AlGaAs.

Other combinations of conductivity types for the various layers of our dual beam laser are also possible, both in the AlGaAs materials system as well as in other systems. Thus, in general the p-n junction should be at one of the interfaces with the active (i.e., lower bandgap) waveguide. In FIG. 1 layer 14 was defined as active, so the p-n junction should either be at the interface with cladding layer 15 or at the opposite interface with passive segment 16.1 and the top of tapered layer 12. On the other hand, if the roles of waveguides 14 and 16 are reversed as previously mentioned, so that layer 16 has a smaller bandgap than layer 14.0 then the p-n junction would either be at the interface between layer 16 and segment 14.1 and the bottom of tapered layer 12, or at the interface between layer 16 and cladding layer 13.

For efficient operation at room temperature, the laser 10 would be mounted on a suitable heat sink (not shown) by means well known in the art.

As mentioned previously, the TMS embodiment of dual beam laser 10 exhibits two outputs which have different wavelengths $\lambda_1$ and $\lambda_2$ (transverse modes) and different lasing thresholds $I_{th1}$ and $I_{th2}$. By suitable application of current pulses of different amplitudes, therefore, the output wavelength can be selected and the relative power of each output can be controlled. For example, the current threshold $I_{th1}$ of the active waveguide mode is typically less than the threshold $I_{th2}$ of the passive waveguide mode, but the wavelength $\lambda_1$ of the active waveguide mode is typically longer than the wavelength $\lambda_2$ of the passive waveguide mode. To select which wavelength (mode) dominates, a train of current pulses 50 (of different amplitudes $I_1$ and $I_2$ can be applied across contacts 28 and 30 by means of pulse generators 52 and 54. These generators can be controlled by suitable electronic switches well known in the art and shown schematically at 51 and 53. The current pulses have amplitudes $I_{th1} < I_1 < I_{th2}$ and $I_{th1} < I_{th2} < I_2$ and are encoded into the train in accordance with information to be transmitted which in turn controls switches 51 and 53. Thus, in pulse train 50 the first and fourth current pulses of amplitudes $I_2$ generate light of wavelength $\lambda_2$ from the passive waveguide 18 and weaker light of wavelength from $\lambda_1$ from the active waveguide, since both thresholds are exceeded. In this case, the laser operates as a TMS so that $\lambda_1$ and $\lambda_2$ correspond to different transverse modes (e.g., $TE_0$ and $TE_1$, respectively). On the other hand, the second and third current pulses of amplitude $I_1$ generate light at $\lambda_1$ from both the active and passive layers, but the latter is of weaker intensity since the threshold for the passive waveguide mode is not exceeded. In this case, the laser operates primarily as a TPD for the active waveguide mode (e.g., $TE_0$).

In addition to the dual wavelength aspect, our laser can also have a relatively large aperture since the passive waveguide can be made relatively thick (e.g., >1 $\mu$m as in the TMS). This configuration may have two advantages: the divergence of the laser beam emitted from the passive waveguide is reduced, thus facilitating coupling into other components such as optical fibers; and the optical power density at mirror 22 is reduced, thus increasing the threshold for catastrophic mirror damage.

Figure 2:
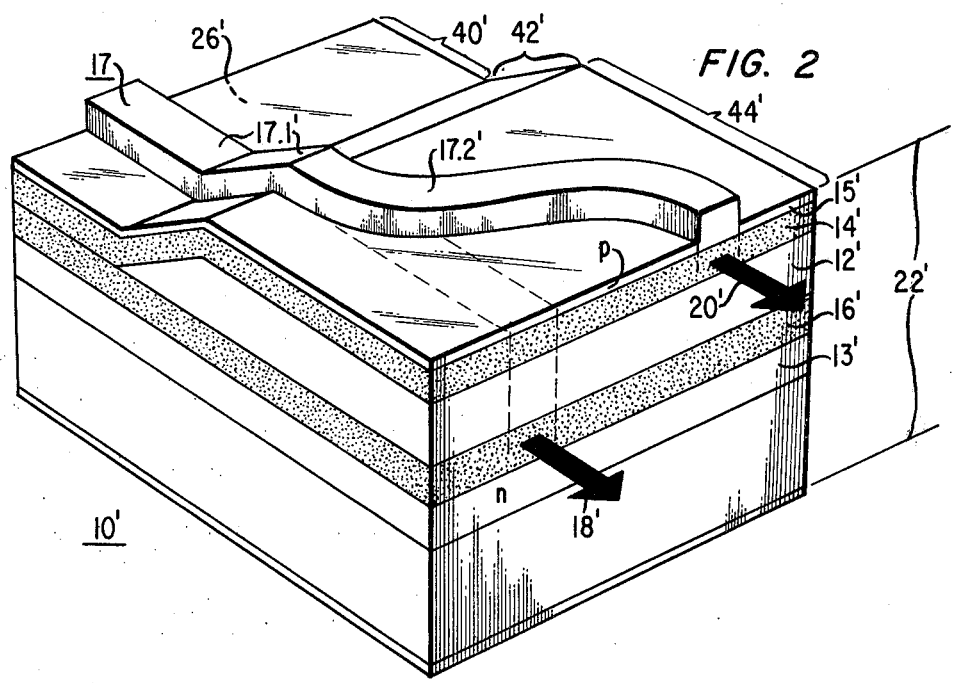
FIG. 2 is a schematic isometric view of our dual beam laser provided with a rib waveguide so as to separate the two outputs horizontally as well as vertically.

Yet another aspect of our invention resides in increasing the spatial separation of the two outputs of our dual beam laser. As depicted in FIG. 2, laser 10' is provided with a rib 17' which separates the output 18' and 20' horizontally at mirror 22'. Vertical separation at mirror 22' is achieved as in FIG. 1 via the branching waveguide layers 14' and 16'. This increased separation may be useful, for example, in facilitating coupling into separate waveguides such as optical fibers. More specifically, using standard photolithographic techniques, the top cladding layer 15' is masked and etched (or anodized) to define rib 17' which has two connected segments: a straight segment 17.1' which extends perpendicular to mirrors 22' and 26', along one side of the laser 10' and above the 4-layer segment 40' and the taper segment 42'; and a reverse-curve segment 17.2' which traverses the 5-layer segment 44' from the one side of the laser 10' to the other. Such ribs are well known in the art and are illustratively about 10 $\mu$m wide and approximately the full height of the original cladding layer; that is, for a cladding layer 15' about 1-2 $\mu$m thick, most of the cladding layer should be removed, leaving less than 0.1 $\mu$m of cladding except under the rib. By virtue of the rib configuration the embodiment of FIG. 2 would also have the advantages of stripe geometry junction lasers in general; i.e., reduced threshold, reduced thermal resistance, control of lasing filaments, etc. Note that in the interests of clarity the electrical contact to cladding layer 15' (and rib 17') has been omitted.

Alternatively, the rib 17' could be fabricated on either major surface of the active layer 14' so that the rib portion 17' would represent a region where the thickness of the active layer 14' is increased. In this case, the rib thickness need only be a few hundred Angstroms in height for an active layer 14' thickness of 0.5 $\mu$m. Another alternative is to fabricate the rib on the passive waveguide 16' and regrow the remaining layers, so that the passive output 18' is displaced to the right of the active output 20' in FIG. 2.

Figure 3:
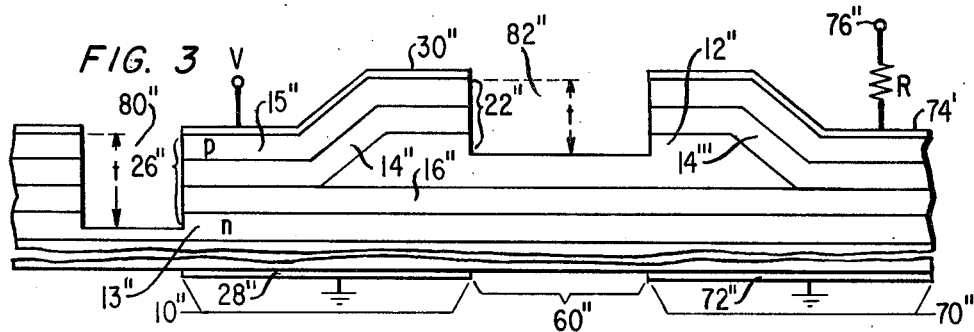
FIG. 3 is a side view of an integrated optical circuit incorporating our dual beam laser.

Although the preceding discussions of our dual beam lasers 10 and 10' assumed discrete laser devices with cleaved crystal facets as mirrors, it is readily possible as shown in FIG. 3 to incorporate a dual beam laser 10" in an integrated circuit with other optical components such as a waveguide section 60" and a detector or modulator 70". In this type of embodiment tapered layer 12" is tapered at both ends as a result of the procedures used in its fabrication (viz, U.S. Pat. No. 3,978,426 granted to R. A. Logan et al on Aug. 31, 1976). Only one taper is shown in FIGS. 1 and 2 because the discrete devices are cleaved between the two tapers. After epitaxial growth of the various layers (i.e., active and passive waveguides 14" and 16", respectively, and cladding layers 13" and 15"), mirrors 22" and 26" are formed at opposite ends of active waveguide 14" by forming wells 80" and 82" to a depth t using either the etching procedures described by us in *Journal of Applied Physics*, Vol. 47, p. 3503 (1976) or standard ion milling techniques. The depth t is chosen so that (i) well 80" on the 4-layer side of laser 10" extends through both the active and passive waveguides 14" and 16", thus forming mirror 26", and (ii) well 82" on the 5-layer side extends through active waveguide 14" but does not reach passive waveguide 16". As a consequence, mirror 22" is formed at one end of active waveguide 14", but passive waveguide 16" is continuous through waveguide section 60" and detector (or modulator) 70". Optionally, mirrors 22" and 26" may be coated with non-conducting, dielectric material to increase their reflectivity. Suitable dielectrics include, for example, ZnS, $Al_2O_3$ and combinations thereof.

Preferably, the thicknesses of the active and passive waveguides 14" and 16" are chosen so that laser 10" functions as a TPD. When forward-biased above threshold (via contacts 28", 30" and voltage source V), laser radiation would be generated in active waveguide 14" as before. A fraction of the optical power (e.g., 20–25%) would be coupled from active waveguide 14" into the wider bandgap passive waveguide 16" where it would be transmitted with little attenuation through waveguide section 60" to another device, e.g., detector or modulator 70". The operation of both types of device 70" depends on coupling radiation from passive waveguide 16" into the lower bandgap layer 14'''. In the case of a detector 70", the radiation coupled into layer 14''' would generate a photocurrent which would flow through a load R via contacts 72″ and 74″. The voltage developed across load R might, for example, be used in a feedback scheme to stabilize laser 10″. On the other hand, in the case of a modulator 72″, a modulating signal source (not shown) would be connected to terminal 76″. Radiation in passive waveguide 16″ would be phase or amplitude modulated in accordance with information to be transmitted because a portion of that radiation penetrates the lower bandgap layer 14‴ where the refractive index or absorption (Franz-Keldesh effect) is modulated by the signal source.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

EXAMPLE

This example describes the actual fabrication and operation of TPD and TMS dual beam lasers of the type shown in FIG. 1. Parameters, such as material composition, layer thickness, carrier concentrations and conductivity types, are given by way of illustration only and are not intended to limit the scope of our invention.

We used standard liquid phase epitaxy (LPE) techniques to fabricate waveguide layers 14 and 16 and cladding layers 13 and 15 from the AlGaAs system on a (100) oriented n-GaAs substrate doped with Si to about $10^{18}$ cm$^{-3}$. In addition, we used the LPE masking technique described in the aforementioned U.S. Pat. No. 3,978,426 of R. A. Logan et al to fabricate the tapered layer 12 from AlGaAs. The parameters of the various layers are given in the following table.

| Layer | x | d (μm) TPD | d (μm) TMS | conductivity type | cm$^{-3}$ |
|---|---|---|---|---|---|
| 15 | 0.3 | ~2 | ~2 | p | $10^{17}$ |
| 14 | 0.0 | 0.5 | 0.3 | n | $<10^{16}$ |
| 12 | 0.3 | 8 | 11 | n | $<10^{16}$ |
| 16 | 0.05 | 0.5 | 1.2 | n | $10^{17}$ |
| 13 | 0.3 | ~2 | ~2 | n | $10^{17}$ |

In the table x corresponds to the mole fraction of AlAs in $Al_xGa_{1-x}As$ and d is the thickness of the layer. Layer 15 was doped with Ge whereas layers 14, 12, 16 and 13 were doped with Sn. Individual lasers were formed in the usual manner by cleaving along (110) planes to define mirrors 22 and 26 and either sawcutting or scribing the sides in the orthogonal (110) direction.

We found that the angle θ of the tapered layer 12 was not strongly affected by its thickness; for both the TPD and TMS $\theta \approx 5$ degrees. However, the symmetry of the waveguides 14 and 16 was varied by changing their thickness: for the TPD the thicknesses were equal, whereas for the TMS the passive waveguide 16 was four times thicker than the active waveguide 14. The lasers were 500 μm long and about 200 μm wide, with the taper approximately centered between mirrors 22 and 26. For comparison, control lasers having no taper were also cleaved from the 4-layer region 40 and 5-layer region 44 of the wafer. Devices were contacted with alloyed Au on the p-side, alloyed Sn on the n-side, and operated under pulsed conditions (100 nsec. at 100 Hz). Differential quantum efficiencies ($\eta_d$=efficiency from both mirrors) and threshold current densities ($J_t$) were measured in the usual fashion. In addition, an optical scanner (oscillating mirror driven by sawtooth voltage) was used to sweep a magnified image of the dual beam output from mirror 22 across a slit, so that the intensities of both output waveguides 14 and 16 could be measured independently at any desired wavelength, or integrated over all wavelengths.

Tapered Power Divider

Figure 4:
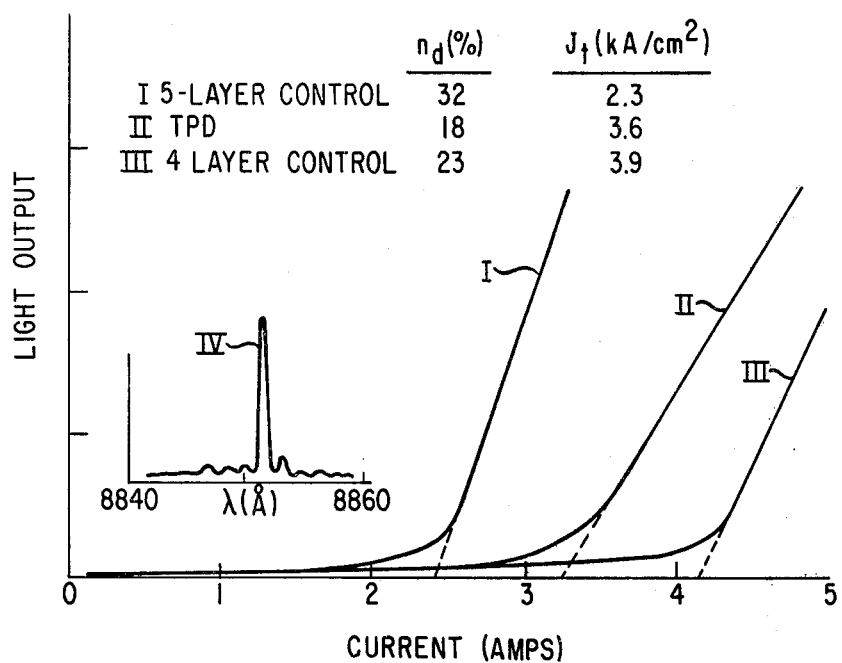
FIG. 4 is a graph showing total light output vs. pumping current for our TPD of FIG. 1 (curve II) and for control samples cleaved from the 5-layer region 44 and 4-layer region 40 of the wafer (curves I and III, respectively). The inset (curve IV) shows the longitudinal modes observed from both the active and passive waveguides; coupling of these two waveguide cavities tends to suppress all but one dominant longitudinal mode.

For the active and passive waveguides 14 and 16 both about 0.5 μm thick, we calculated $A \approx 0.3$ from Eq. (1), and expected the device to operate as a TPD. Scanner measurements indicated this to be the case: the optical power ratio for active:passive waveguides was found to be constant for all pumping currents up to about $1.6 \times J_t$. This ratio was 4:1 for the TPD laser described in the table, and generally varied between 4:1 and 5:1 for all lasers taken from this wafer. The calculated distribution of optical power in waveguide layers 14 and 16 on the 4-layer side 40 of the taper was 70:30. Identical spectra were measured from each output waveguide 14 and 16. The inset to FIG. 4 (curve IV) shows the TPD lasing in a dominant single longitudinal mode due to coupling of the active and passive waveguide cavities; the second strongest mode is only about 15% of the principal mode for a current of $1.2 \times J_t$. In contrast, three strong modes were observed near threshold for a 4-layer control laser, and a large number of modes (>20) oscillated for the 5-layer control laser. As shown by curve II of FIG. 4, the threshold current density for the TPD was $J_t$=3.6 kA/cm$^2$, intermediate between that measured for 4-layer (curve III) and 5-layer (curve I) control lasers, as expected. Furthermore, reasonable quantum efficiencies ($n_d$=18%) were obtained from the TPD.

Tapered Mode Splitter

Figure 5:
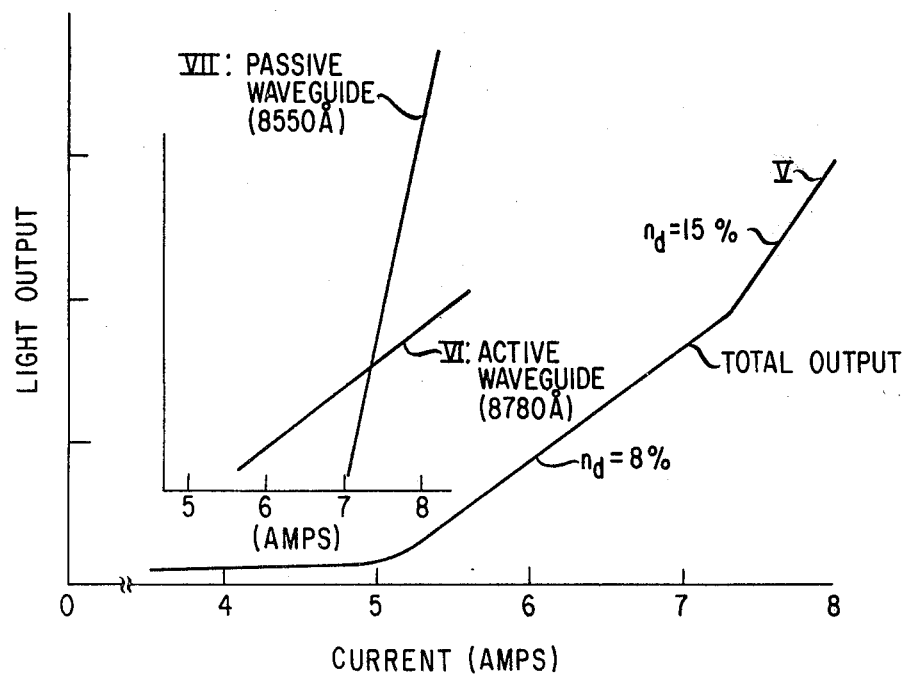
FIG. 5 is a graph showing total light output vs. current for our TMS of FIG. 1 in which the change in slope of curve V represents threshold for a second transverse mode. The inset shows the intensities observed separately from the active (curve VI) and passive (curve VII) waveguides, as determined by optical scanner measurements.

The asymmetry of layer thicknesses for the TMS device listed in the table led to a larger value for the transition parameter, $A \approx 0.5$, so the TMS mode of operation was favored. The measurement of light output vs. pumping current for this laser (FIG. 5, curve V) exhibited two distinct regions, with efficiencies $n_d$=8% and 15%. The intensity ratio of the active:passive waveguides was no longer independent of pumping current, as determined from optical scanner traces (not shown). Most of the optical power was emitted from the active waveguide 14 for currents up to above 7 amps; above this point the output power from the passive waveguide 16 began to dominate. Relative intensities measured from these scanner traces were plotted as a function of current in the inset to FIG. 5; thresholds of about 5 and 7 amps were observed from the active and passive waveguides, curves VI and VII respectively. The spectral dependence of the output was significant. We found that the lower threshold of 5 amps corresponded to a mode lasing at a wavelength $\lambda \approx 8780$ Angstroms, while at 7 amps another mode began to lase at $\lambda \approx 8550$ Angstroms. This effect was clearly demonstrated by the monochromatic scanner traces, for a pumping current corresponding to equal light intensities in the active and passive output waveguide 14 and 16. These traces demonstrated that the output from the passive waveguide 16 was predominantly at $\lambda \approx 8550$ Angstroms, while the active waveguide 14 lased only at $\lambda \approx 8550$ Angstroms. The laser therefore operated as a dual beam laser, with radiation at 8550 Angstroms obtained from one output waveguide at high pumping levels, and at 8780 Angstroms from the other waveguide at low pumping levels.

The mode at 8550 Angstroms resulted from the recombination of minority carriers injected into the passive waveguide 16 because carriers were not completely confined by the small bandgap discontinuity at heterojunction 14.4. The threshold for this mode was relatively high because: (i) the effective width of the waveguide comprising both layers 14 and 16 was large, and (ii) radiation was generated in, and carriers were injected into, passive waveguide 16 only in the segment 16.1 of the 4-layer region 40 of the laser (i.e., in the 5-layer region 44, layer 12 blocks such injection into passive waveguide segment 16.2). We therefore expect an improvement in device performance would result by making both waveguides 14 and 16 thinner (thus, increasing the gain) and by putting the taper closer to mirror 22 (thus, increasing the size or radiation generating portion 40). Injection into waveguide segment 16.1 can be reduced, if desired, by increasing the bandgap discontinuity at heterojunction 14.4 (e.g., by increasing the mole fraction x of AlAs therein), as long as the bandgap discontinuity is still small enough to allow penetration of radiation from active segment 14.1 into passive segment 16.1.

What is claimed is:

1. A heterostructure laser comprising
first and second wide bandgap semiconductor cladding layers of opposite conductivity types, and
a narrower bandgap semiconductor active region disposed between and contiguous with said first and second layers CHARACTERIZED IN THAT said region includes:
a passive waveguide semiconductor layer contiguous and coextensive with said first cladding layer and having a smaller bandgap than said first layer,
an active waveguide semiconductor layer contiguous and coextensive with said second cladding layer and having a smaller bandgap than both said second layer and said passive waveguide layer, said active waveguide layer being capable of generating stimulated radiation by recombination of minority carriers injected therein when said first and second layers are forward biased and pumping current is applied thereto in excess of the lasing threshold,
said active and passive waveguide layers each having longitudinally adjacent first and second segments, said first segments being contiguous with one another and said second segments being separated from one another,
a tapered semiconductor layer contiguous with and separating said second segments and having a bandgap greater than that of said active and passive waveguide layers, said tapered layer having a taper which extends along the longitudinal axis of said laser so that said laser emits physically separate radiation outputs from either or both said active waveguide layer and said passive waveguide layer,
means for receiving a voltage to forward bias said first and second layers, and
resonator means for providing feedback of said radiation to said active waveguide.

2. The laser of claim 1 including a p-n junction formed at a major surface interface with said active waveguide layer.

3. The laser of claim 2 wherein said p-n junction is formed at the interface between said active waveguide and said second cladding layer.

4. The laser of claim 2 wherein said p-n junction is formed at the interface between said first segments and at the interface between said second segment of said active waveguide layer and said tapered layer.

5. The laser of claim 1 wherein said active and passive waveguide layers have substantially equal thicknesses and substantially the same composition of material, and the angle of said taper and the propagation constants of said active and passive waveguide layers are mutually adapted so that said outputs have the same wavelength and lasing threshold.

6. The laser of claim 5 wherein said first segments are optically coupled to one another so that all but a single dominant longitudinal mode of said radiation is suppressed in said active and passive waveguide layers.

7. The laser of claim 1 wherein said passive waveguide layer is much thicker than said active waveguide layer, and the angle of said taper and the propagation constants of said active and passive layers are mutually adapted so that said outputs have different wavelengths and different lasing thresholds.

8. The laser of claim 7 further including means for applying current pulses of different amplitude to said laser so that said different thresholds are selectively exceeded, thereby generating at different times selectively different wavelength outputs from said active and passive waveguide layers.

9. The laser of claim 1 wherein one of said layers includes on a major surface thereof a rib waveguide which guides radiation in one of said waveguide layers from one side of said laser to another, thereby separating said outputs horizontally as well as vertically.

10. The laser of claim 9 wherein said rib waveguide has a straight segment and a reverse curve segment connected thereto, said straight segment being in the portion of said laser which includes said first segments of said active and passive waveguide layers as well as said taper and extending parallel to said longitudinal axis, and said reverse curve segment being in the portion of said laser which includes said second segments of said active and passive waveguide layers and extending from a region nearer to one side of said laser to a region nearer to the other side of said laser.

11. The laser of claim 1 wherein said active and passive waveguide layers have the same conductivity type.

12. The laser of claim 11 wherein said active waveguide layer and second cladding layer have opposite conductivity types.

13. The laser of claim 1 wherein said active and passive waveguide layers have opposite conductivity types.

14. The laser of claim 13 wherein said active waveguide layer and second cladding layer have the same conductivity type.

15. The laser of claim 1 wherein the interface between said first segments is a heterojunction which permits substantial penetration of said radiation from said active waveguide layer into said passive waveguide layer.

16. The laser of claim 15 wherein said heterojunction also permits the injection of carriers into said passive waveguide layer and hence the generation of laser radiation therein.

17. A heterostructure junction laser comprising:

an $Al_xGa_{1-x}As$ first cladding layer of one conductivity type, $0<x<1$;

an $Al_rGa_{1-r}As$ second cladding layer of the opposite conductivity type, $0<r<1$;

an $Al_yGa_{1-y}As$ passive waveguide layer contiguous and coextensive with said first cladding layer, $0<y<1$, $y<x$;

an $Al_qGa_{1-q}As$ active waveguide layer contiguous and coextensive with said second cladding layer, $0\leq q\lesssim 0.4$, $q<r$ and $y$, said active waveguide layer being capable of generating stimulated radiation therein by recombination of minority carriers injected therein when said cladding layers are forward biased and pumping current is applied thereto in excess of the lasing threshold;

said active and passive waveguide layers each having longitudinally adjacent first and second segments, said first segments being contiguous and forming a heterojunction at the interface therebetween, said second segments being separated from one another, said radiation being generated in said first segment of said active layer, and (y-r) being small enough to permit a substantial portion of said radiation to penetrate from said active waveguide layer into said passive waveguide layer;

a tapered $Al_zGa_{1-z}As$ layer contiguous with and separating said second segments, $z>y$ and $q$, $0<z<1$, said tapered layer having a taper which extends along the longitudinal axis of said laser so that said laser emits physically separate radiation outputs from either or both said active and passive waveguide layers;

means for receiving a voltage to forward bias said first and second layers, and resonator means for providing feedback of said radiation to said active waveguide.

* * * * *